US006322620B1

(12) United States Patent
Xiao

(10) Patent No.: US 6,322,620 B1
(45) Date of Patent: Nov. 27, 2001

(54) CONDUCTIVE INK COMPOSITION

(75) Inventor: Yue Xiao, Belle Mead, NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/714,646

(22) Filed: Nov. 16, 2000

(51) Int. Cl.[7] ................................................. C09D 11/10
(52) U.S. Cl. .................. 106/31.92; 523/442; 523/457; 523/458; 523/459; 523/460; 523/468
(58) Field of Search ............... 106/31.72, 31.92; 523/442, 457, 458, 459, 460

(56) References Cited

U.S. PATENT DOCUMENTS

| | | |
|---|---|---|
| 3,745,045 | 7/1973 | Brenneman . |
| 4,479,890 | 10/1984 | Prabhu . |
| 4,535,012 | 8/1985 | Martin . |
| 4,552,690 | 11/1985 | Ikeguchi . |
| 4,564,563 | 1/1986 | Martin . |
| 4,962,139 | * 10/1990 | Lo ........................................ 523/468 |
| 5,061,551 | 10/1991 | Durand . |

FOREIGN PATENT DOCUMENTS

| | | |
|---|---|---|
| 0140585 | 9/1984 | (EP) . |
| 0143530 | 9/1984 | (EP) . |
| 2135673A | 2/1984 | (GB) . |
| 50022582 | 3/1975 | (JP) . |
| 60004552 | 1/1985 | (JP) . |
| 64056777 | 8/1987 | (JP) . |
| 125311 | 3/1988 | (JP) . |
| 63089577 | 3/1988 | (JP) . |
| 63057677 | 4/1988 | (JP) . |
| 04268381 | 12/1988 | (JP) . |
| 2155113 | 12/1988 | (JP) . |
| 01085248 | 3/1989 | (JP) . |
| 01098674 | 4/1989 | (JP) . |
| 01174573 | 7/1989 | (JP) . |
| 01193106 | 3/1991 | (JP) . |
| 04016973 | 1/1992 | (JP) . |
| 04081469 | 3/1992 | (JP) . |
| 05117419 | 5/1993 | (JP) . |
| 05225822 | 9/1993 | (JP) . |
| 9240168 | 3/1996 | (JP) . |
| 9265953 | 3/1997 | (JP) . |
| WO 91/20088 | 12/1991 | (WO) . |

OTHER PUBLICATIONS

Kessenikh, R.M.;Temperature Dependence of the Electrical Conductivity of Modified and Plasticized Epoxy Compounds Heat–Cured In Strong Fields; Izv. Vyssh. Ucheb. Zaved., Fiz. (1969); 12(10; 133–6; Russia.

Anonymous; Rapid Curing of Adhesives in Precise Locations by Conduction Heating.

Sancaktar, E.; Electric Resistive Heat Curing of the Fiber––Matrix Interphase in Graphite/Epoxy Composite; Journal of Mechanical Design; pp. 53–60; Mar. 1993, vol. 115.

Plapp, Nile; A Vapor Phase Solution for Curing Conductive Epoxy Adhesives; Surface Mount Technology; 48–50; Aug. 1993.

Sancaktar, E; Electric Resistive Heat Curing of the Fiber––Matrix Interphase in Graphite/Epoxy Composites DE–vol. 30, Reliability, Stress Analysis and Failure Prevention ASME 1991; pps127–137.

\* cited by examiner

*Primary Examiner*—Robert Dawson
*Assistant Examiner*—D. Aylward
(74) *Attorney, Agent, or Firm*—Charles W. Almer

(57) ABSTRACT

A thermoset conductive ink for use in through hole interconnections or similar electric and electronic applications to provide stable electrical connections. The conductive ink of this invention comprises a thermal curable resin system having an admixing of an epoxy resin, a cross-linking agent and a catalyst, an electrically conductive material such as silver, copper or silver-coated copper and an organic solvent.

15 Claims, 2 Drawing Sheets

CONDUCTIVE INK COMPOSITION

FIELD OF THE INVENTION

This invention relates to an electrically conductive ink composition having improved properties for use in various electronic applications.

BACKGROUND OF THE INVENTION

Many different forms of electronic devices employ printed circuit boards having electronically conductive ink compositions. Conductive ink compositions are screen printable and are used to form conductive elements in electronic applications. For example, conductive inks are utilized as screen-printed electronic circuitry in through hole connection, jumpers, printed board wiring and similar electronic applications to provide stable electrical interconnections. Most currently available conductive inks generally consist of phenolic resin. Some currently available conductive inks also contain an epoxy resin or a mixture of resins, such as acetylacetone with cyanic acid ester resin or acrylic resin with melamine resin. Such compositions also contain electrically conductive filler materials which are dispersed in the resins and which remain an integral part of the final composition after processing.

There are many drawbacks to currently available conductive inks. One such drawback is that many conductive inks have very short shelf-lives at room temperature. These inks are very difficult to transport and store. Shipping, in particular, is quite difficult in that the inks must be maintained within a coolant, such as dry ice for the duration of the transit. A further drawback of conductive inks is that they frequently require high drying and curing temperatures and relatively long drying and curing times. Consequently, it would be advantageous to develop a conductive ink which would exhibit long shelf life at room temperatures. It would further be advantageous to provide an ink which would require lower drying and curing temperatures at shorter drying and curing times.

Additional properties are also desired in a thermoset conductive ink. One such desired property is that the conductive ink be sufficiently conductive, or have low electrical resistivity, to carry an electric current when cured. Other desired properties are that the conductive ink have good abrasion and chemical resistance when cured so that it is not easily scratched or wiped off by solvent and that it have acceptably good adhesion to the substrate, commonly a copper substrate, when cured. Further, it is desired that the conductive ink provides good rheology for good screen printability and is stable at relatively high temperatures on the substrate so that it is not affected by any heat treatment which may be necessary.

Accordingly, it would be advantageous to provide a conductive ink which provides a long shelf life at room temperature, low drying and curing temperatures and short drying and curing times. It would be further advantageous to provide such a conductive ink which provides the other desired benefits of a conductive ink.

SUMMARY OF THE INVENTION

Figure 1:
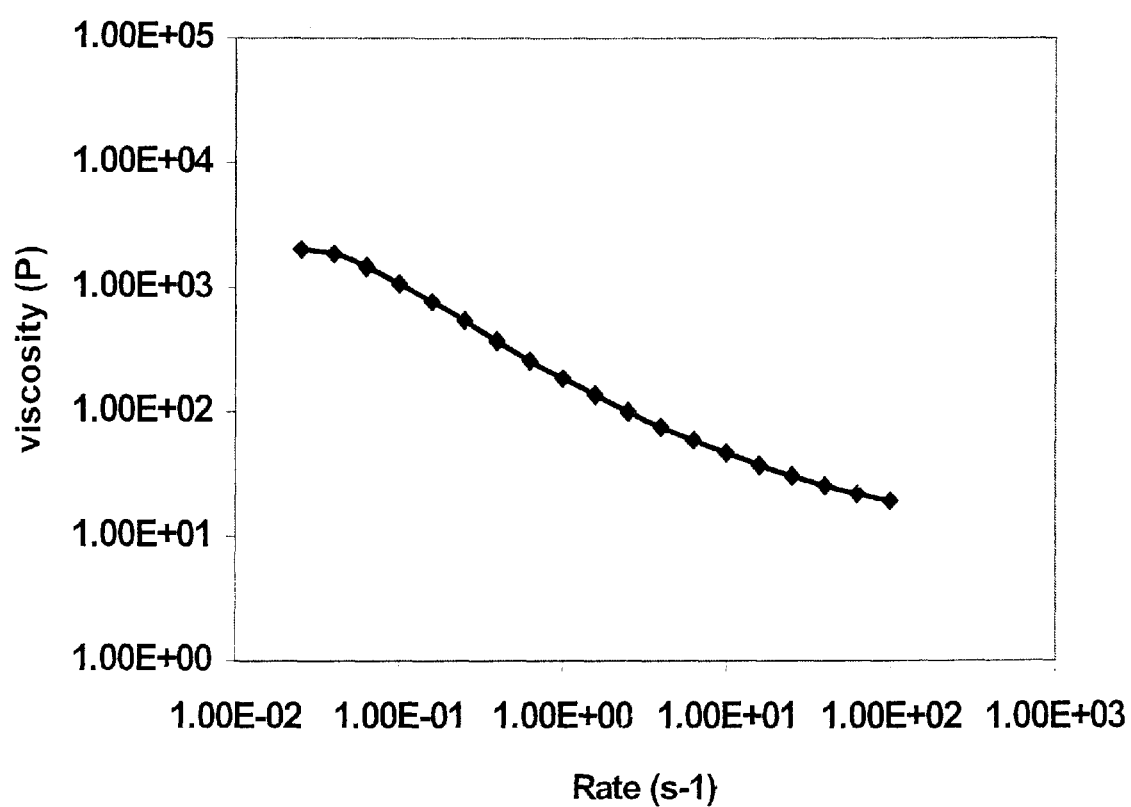
FIG. 1 is a graph of the medium range shear thinning viscosity of the composition.

This invention relates to a thermoset conductive ink for use in through hole interconnections or similar electric and electronic applications to provide stable electrical connections. The conductive ink of this invention comprises a thermal curable resin system having an admixing of an epoxy resin, a cross-linking agent and a catalyst, an electrically conductive material such as silver, copper or silver-coated copper and an organic solvent.

DETAILED DESCRIPTION OF THE INVENTION

Conductive inks commonly have consisted of phenolic resin, an epoxy resin, or a mixture of resins. By incorporating the combination of resin and other ingredients, such as methoxymethylmelamine, of the present invention the resulting conductive ink provides advantageous shelf life and curing and drying times and temperatures. In addition, the conductive ink of the present invention good screen printability, high temperature stability, good cohesive strength and chemical resistance, and good adhesion to a copper substrate.

The conductive ink of the present invention comprises a) a thermal curable resin system comprising an admixture of about 1 to about 20 wt % of at least one epoxy resin, and about 0.2 to about 15 wt % of methoxymethylmelamine as a cross-link agent, and about 0.1 to about 5 wt % of a catalyst such as an acid; b) about 50 to about 90 wt % of a particulated electrically conductive material; and c) about 5 to about 50 wt % of an organic solvent. Optional ingredients include flow additives, adhesion promoters and rheology modifiers and are preferably added in the amounts of about 0.01 to about 5 wt %.

The preferred epoxy resin for use with the present invention is a solid or liquid epoxy resin derived from bisphenol-A and epichlorohydrin. The epoxy resin has an average of 1 to 11 hydroxyl groups per molecule plus the terminal epoxy groups. One exemplary resin which may be employed in the conductive ink is an epoxy resin such as Epon 1007 (Shell Corporation). A preferred methoxymethylmelamine is hexamethoxymethylmelamine, such as Cymel 303 (Cytec Industries).

Various catalysts may be employed in the resin admixture. The presence of a strong proton acid is normally required to catalyze the cross-linking reaction of fully alkylated amino reactions at reasonably low temperatures. The acids utilized may be, according to their pKa values, mineral acids, p-toluene sulfonic acid, dinonylnaphthalene disulfonic acid, dodecyl benzene sulfonic acid, oxalic acid, maleic acid, hexamic acid, phosphoric acid, alkyl phosphate ester, phthalic acid and acrylic acid. The most preferred acid is dinonylnaphthalene disulfonic acid.

The electrically conductive material may comprise silver, copper, silver-coated copper, silver-coated aluminum, coated mica, glass spheres, or mixtures thereof. A preferred silver is MR37002 (Acheson Colloids).

Organic solvents are utilized to substantially dissolve the resin system and to adjust the viscosity of the inks in order to make the ink best suited to form conductive circuitry on substrates with through hole connections. Solvents which may be utilized include diethyl glycol, monoethyl ether, diethylene glycol dimethylene ether, dibasic ester solvent, carbitol, carbitol acetate, butyl carbitol, butyl carbitol acetate, acetone, methyl ethyl ketone, cyclohexanoe, diethylene glycol monoethyl ether acetate, diethylene glycol monobutyl ether acetate and dipropylene glycol monomethyl ether. The most preferred solvent is dipropylene glycol monomethyl (Arcosolv DPM, Arco Chemical).

Optionally, suitable flow additives, adhesion promoters, conductivity additives, and rheology modifiers may be added as desired. Optional flow additives include silicon polymers, ethyl acrylate/2-ethylhexyl acrylate copolymers, alkylol ammonium salt of acid phosphoric acid esters of ketoxime or mixtures thereof. Suitable adhesion promoters include various forms of silane and preferably mercaptosilane which provides especially enhanced adhesion on copper substrates. Suitable rheology modifiers include thermoplastic resin and preferably polyvinyl acetal. Suitable conductivity additives include hydroquinone, Vitamin E, metallic dryers, titanates, phosphoric acid and other acid catalysts.

The invention can be further described by the following examples.

EXAMPLE 1(A)

A conductive dispersion was formed by first dissolving an epoxy resin and polyvinyl acetal in dipropylene glycol monomethyl ether using a magnetic stirring bar. Hexamethoxymethylmelamine, a strong sulfonic acid, and a mercaptosilane adhesion promoter were added to the mixture. Silver flake was then added into the mixer and the resultant mixture was agitated in the steel propeller-agitated mixer for approximately 30 minutes. This dispersed mixture was then tested as discussed below. Each individual component and its weight and weight percentages are given in the following Table 1.

TABLE 1

| Component | weight (g) | wt % |
|---|---|---|
| Epoxy (Epon 1007, Shell Corp.) | 1.1445 | 5.77% |
| Dipropylene glycol monomethyl ether (Arcosolv DPM, Arco Chemical) | 6.0672 | 30.59% |
| Polyvinyl acetal (Butvar B76, Solutia, Inc) | 0.2965 | 1.50% |
| Hexamethoxymethyl melamine (Cymel 303, Cytec Industries) | 0.2 | 1.01% |
| Sulfonic acid (Cycat 500, Cytec Industries) | 0.1016 | 0.51% |
| Mercaptosilane (M8500, United Chemical Technologies) | 0.007 | 0.04% |
| 4-aminophenyl disulfide | 0.014 | 0.07% |
| Silver flake | 12 | 60.51% |
| (Acheson Colloids) | | |
| Total | 19.8308 | 100.00% |

The resulting uncured dispersion was tested for solid content and shear thinning performance. The composition was found to have a solid content of about 69 wt % and a medium range shear thinning performance with viscosity of 19, 46, 185 and 1082 p at shear rate of 0.1, 1, 10 and 100 s$^{-1}$, respectively. These parameters indicate that this conductive ink provides suitable screen printability for its intended end uses.

EXAMPLE 1(B)

The compositions A, B, C, and D are shown in Table 2. The making of these compositions followed the same procedures described in Example 1(A).

TABLE 2

| | A | | B | | C | | D | |
|---|---|---|---|---|---|---|---|---|
| Epon 1007 | 5.667 g | 5.9% | 5.667 g | 5.6% | 5.010 g | 5.3% | 5.01 g | 5.1% |
| Cymel 303 | 1 g | 1.0% | 1 g | 1.0% | 1.657 g | 1.7% | 1.657 g | 1.7% |
| Cycat 500 | 0.508 g | 0.5% | 0.508 g | 0.5% | 0.508 g | 0.5% | 0.508 g | 0.5% |
| Silane A187 | 0.035 g | 0.0% | 0.035 g | 0.0% | 0.035 g | 0.0% | 0.035 g | 0.0% |
| Arcosolve | 29.241 g | 30.3% | 30.406 g | 30.3% | 28.61 g | 30.0% | 28.61 g | 29.0% |
| Silver flake | 59.0186 g | 61.1% | 61.370 g | 61.1% | 58.076 g | 60.9% | 61.37 g | 62.2% |
| Butvar 76 | 1.101 g | 1.1% | 1.468 g | 1.5% | 1.101 g | 1.2% | 1.468 g | 1.5% |
| Butvar 74 (Solutia, Inc) | | | | | 0.367 g | 0.4% | | |

The viscosity of uncured dispersion was measured by Brookfield and listed in Table 3 as following:

TABLE 3

| Shear rate (rpm) | D (cp) | C (cp) | A (cp) | B (cp) |
|---|---|---|---|---|
| 0.5 | 9830 | 8192 | 9011 | 10650 |
| 1 | 7372 | 5734 | 6144 | 7372 |
| 10 | 2867 | 2089 | 2498 | 2867 |
| 50 | 1835 | 1343 | 1613 | 1867 |
| 100 | 1593 | 1192 | 1429 | 1626 |

As illustrated in FIG. 1, the medium range shear thinning viscosity produced by these samples indicates that these conductive dispersions are easily screen printable for the intended end uses.

EXAMPLE 2

In order to test for high temperature stability, the conductive dispersion from Example 1(A) was screen printed onto an epoxy glass-type printed wiring board (FR-4), or a phenolic-type printed wiring board (FR-2) with through hole connections. The screened dispersion was dried in a convection oven for 30 minutes at 70° C., followed by curing for 30 minutes at 150° C. The resulting through hole connections have a regular hole shape with smooth cross cut section coating. The resistance of each coated through hole was measured by a 4-probe multimeter. The initial hole resistance was 0.033/hole. The board was then dipped into a solder bath for ten seconds at 250° C. The through hole resistance was measured again after the board was cooled to room temperature. The through hole resistance was 0.009, 0.009, and 0.010/hole after one, three, and five solder dips. This result indicates that this cured conductive ink has a high electrical conductivity and remains stable when subjected to high temperatures for short periods of time.

EXAMPLE 3

The compositions A1, A2, A4, B1, B2 and B4 are set out in Tables 4 and 5. These compositions were manufactured following the same procedures described in Example 1(A).

TABLE 4

|  | A1 weight (g) | wt % | A2 weight (g) | wt % | A4 weight (g) | wt % |
|---|---|---|---|---|---|---|
| Epon 1007F | 1.1445 | 6.08% | 1.1445 | 5.92% | 1.1445 | 5.63% |
| Diluent 3 | 6.0672 | 32.22% | 6.0672 | 31.39% | 6.0672 | 29.84% |
| Butvar B76 | 0.2965 | 1.57% | 0.2965 | 1.53% | 0.2965 | 1.46% |
| Cymel 303 | 0.2 | 1.06% | 0.2 | 1.03% | 0.2 | 0.98% |
| Cycat 500 | 0.1016 | 0.54% | 0.1016 | 0.53% | 0.1016 | 0.50% |
| M8500 mercaptosilane | 0.007 | 0.04% | 0.007 | 0.04% | 0.007 | 0.03% |
| 4-aminophenyl disulfide | 0.014 | 0.07% | 0.014 | 0.07% | 0.014 | 0.07% |
| Silver flake | 11 | 58.42% | 11.5 | 59.49% | 12.5 | 61.48% |
| Sum | 18.8308 | 100.00% | 19.3308 | 100.00% | 20.3308 | 100.00% |

TABLE 5

|  | B1 weight (g) | wt % | B2 weight (g) | wt % | B4 weight (g) | wt % |
|---|---|---|---|---|---|---|
| Epon 1007F | 1.1445 | 6.08% | 1.1445 | 5.92% | 1.1445 | 5.63% |
| Diluent 3 | 6.0672 | 32.22% | 6.0672 | 31.39% | 6.0672 | 29.84% |
| Butvar B76 | 0.2965 | 1.57% | 0.2965 | 1.53% | 0.2965 | 1.46% |
| Cymel 303 | 0.2 | 1.06% | 0.2 | 1.03% | 0.2 | 0.98% |
| Cycat 500 | 0.1016 | 0.54% | 0.1016 | 0.53% | 0.1016 | 0.50% |
| M8500 mercaptosilane | 0.007 | 0.04% | 0.007 | 0.04% | 0.007 | 0.03% |
| 4-aminophenyl disulfide | 0.014 | 0.07% | 0.014 | 0.07% | 0.014 | 0.07% |
| Silver flake | 11 | 58.42% | 11.5 | 59.49% | 12.5 | 61.48% |
| Sum | 18.8308 | 100.00% | 19.3308 | 100.00% | 20.3308 | 100.00% |

The compositions were subjected to the high temperature solder bath test, as described in Example 2 and the results are listed in Table 6.

TABLE 6

|  | initial resistance ( ) | 1st solder dip | 3rd solder dip | 5th solder dip |
|---|---|---|---|---|
| A1 | 0.0289 | 0.0140 | 0.0154 | 0.0172 |
| A2 | 0.0248 | 0.0146 | 0.0147 | 0.0193 |
| A4 | 0.0163 | 0.0099 | 0.0127 | 0.0230 |
| B1 | 0.0525 | 0.0127 | 0.0113 | 0.0152 |
| B2 | 0.0396 | 0.0085 | 0.0090 | 0.0114 |
| B4 | 0.0266 | 0.0081 | 0.0074 | 0.0117 |

These results illustrate that these cured conductive compositions have a high electrical conductivity and are stable at high temperatures for short period of time.

EXAMPLE 4

Figure 2:
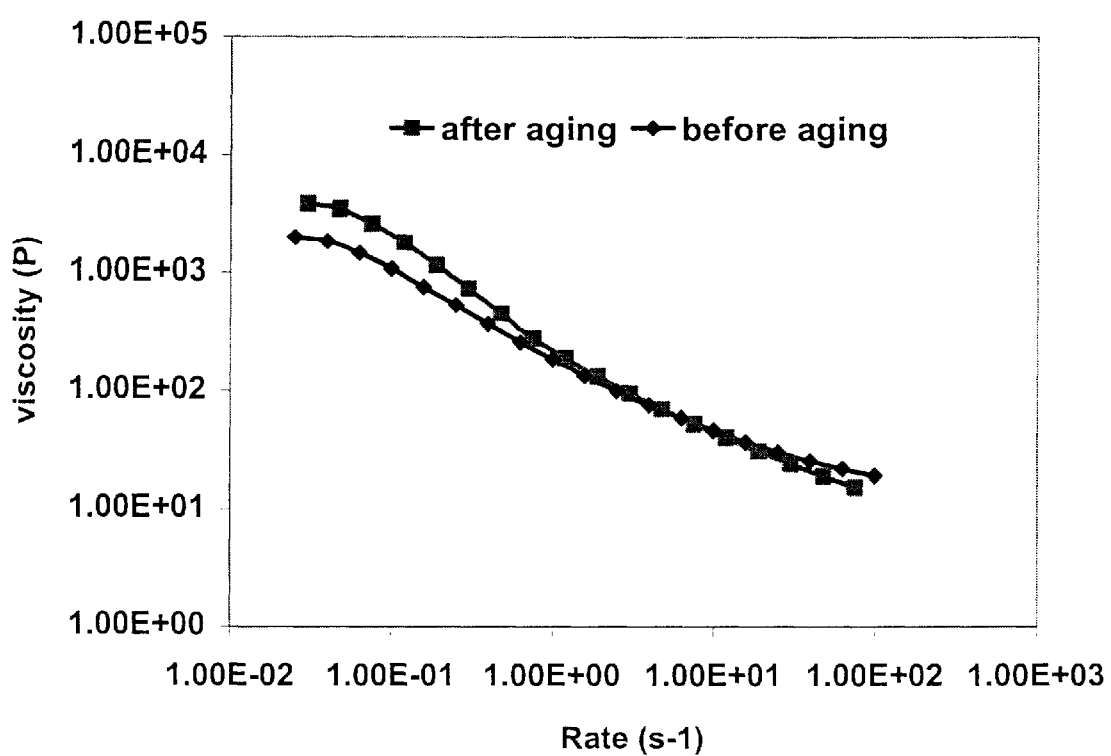
FIG. 2 is a graph of the viscosity before and after aging.

To measure the shelf life of the composition at room temperature, the resulting conductive dispersion from Example 1(A) was stored in a glass jar with sealed cap. After being sealed in the jar, the sample was aged at 40° C. for 4 weeks in a convection oven. The viscosity of the dispersion was measured again at room temperature after aging. As illustrated in FIG. 2, the viscosity does not show a significant change after aging. The lack of a change in viscosity after aging illustrates that the uncured dispersion has a relatively long shelf life at room temperature.

EXAMPLE 5

The cohesive strength and chemical resistance of the composition were tested via the sheet resistivity test. The test was performed by placing the composition of Example 1(A) along the length of a glass slide over a length of 76 mm, at an approximate thickness of 20 μm, and width of 5 mm, and then drying the slide in a convention oven for 30 minutes at 70° C. The slide was then cured for 30 minutes at 150° C. The sheet resistance of the composition was measured by using a 4-probe multimeter. Next, a strip of Scotch 810 adhesive tape was placed along the entire length of the pattern of composition on the glass slide with the adhesive contacting the composition. A 1.5 kg weight was rolled over the tape 6 times. The glass slide was secured in a vertical position and an end of the tape was pulled from the composition and allowed to hang vertically down from the glass slide. A 500 g weight was attached to the end of the tape and allowed to fall and peel the tape from the glass slide. The resistance was then measured again. The resulting slight change in sheet conductivity as shown in Table 7 illustrates that the cured conductive composition has good cohesion strength.

TABLE 7

|  | initial sheet resistance (Ω) | Sheet resistance after peel test |
|---|---|---|
| A1 | 0.6556 | 0.6505 |
| A2 | 0.3987 | 0.4020 |
| A4 | 0.3033 | 0.2988 |
| B1 | 0.6455 | 0.6444 |
| B2 | 0.6187 | 0.6147 |
| B4 | 0.3391 | 0.3661 |
| Example 1(A) | 0.3682 | 0.3644 |

EXAMPLE 6

Another glass slide coated with conductive ink was prepared and cured in the same way as described above. The sheet resistance of the conductive ink on the slide was measured by 4-probe multimeter. Next, the conductive film was wiped by an acetone saturated cotton swab. The sheet resistance was measured again after one hundred wipes with the solvent swab. The slight change in sheet resistivity as shown in Table 8 for the compositions of Example 1(A) and Example 3 illustrates that the cured composition is not dissolved in the solvent and has good solvent resistance.

TABLE 8

| | initial sheet resistance (Ω) | Sheet resistance after peel test |
| --- | --- | --- |
| A1 | 0.6544 | 0.6951 |
| A2 | 0.4202 | 0.4327 |
| A4 | 0.3163 | 0.3295 |
| B1 | 0.6497 | 0.6603 |
| B2 | 0.5654 | 0.5772 |
| B4 | 0.3391 | 0.3660 |
| Example 1(A) | 0.4078 | 0.4232 |

EXAMPLE 7

The adhesion test vehicle consisted of the test composition cured on a copper coupon. The composition in Example 1(A) was dispensed along the 4" length of a glass slide, in an approximate thickness of 20 μm, and width of 1 inch, and then dried in a convention oven for 30 minutes at 70° C., followed by curing for 30 minutes at 150° C. The cured film was cut into 10 by 10 squares with 1 mm apart. One inch-wide semi-transparent pressure sensitive Permacel 99 tape was applied on the cutting pattern and rubbed with rubber eraser to guarantee a firm attachment. Then the tape was quickly pulled from the board and adhesion strength was graded based on ASMT D 3359 with a range of grading from 5B being the best and 0B being the worst. The adhesion result was graded as 5B.

The compositions in Example 3 were tested for adhesion following the same procedures for the cross cut adhesion test as described above. The test results are listed in Table 9.

TABLE 9

| Sample | cross-cut adhesion |
| --- | --- |
| A1 | 4B |
| A2 | 4B |
| A4 | 4B |
| B1 | 5B |
| B2 | 5B |
| B4 | 4B |

While the invention has been described with particular reference to certain embodiments thereof, it will be understood that changes and modifications may be made by those of ordinary skill within the scope and spirit of the following claims.

What is claimed is:

1. A conductive ink for providing stable electrical connections comprising
   (a) a thermal curable resin system comprising at least one epoxy resin, a cross-linking agent and a catalyst, wherein the cross-linking agent comprises methoxymethylmelamine;
   (b) a particulated electrically conductive material; and
   (c) an organic solvent.

2. The conductive ink of claim 1, wherein the conductive ink further comprises one of more flow additives, adhesion promoters, rheology modifiers, conductivity additives or mixtures thereof.

3. The conductive ink of claim 2, wherein
   (a) the thermal resin system is present in an amount of about 1 to 20 weight percent of the at least one epoxy resin, about 0.2 to 15 weight percent of the methoxymethylmelamine and about 0.1 to 5 weight percent of the catalyst;
   (b) the particulated electrically conductive material is present in an amount of about 50 to 90 weight percent;
   (c) the organic solvent is present in an amount of about 5 to 50 weight percent; and
   (d) the flow additives, adhesion promoter, rheology modifiers,conductivity additives or mixtures thereof are present in amount of about 0 to 5 weight percent; for a total of 100 weight percent.

4. The conductive ink of claim 3, wherein the particulated electrically conductive material is silver, copper, silver-coated copper, silver-coated aluminum, coated mica, glass spheres or mixtures thereof.

5. The conductive ink of claim 4, wherein the catalyst is an acid.

6. The conductive ink of claim 5, wherein the at least one epoxy resin is a solid or liquid epoxy resin derived from bisphenol-A and epichlorohydrin.

7. The conductive ink of claim 5, wherein the acid is selected from the group consisting of mineral acids, p-toluene sulfonic acid, dinonylnaphthalene disulfonic acid, dodecyl benzene sulfonic acid, oxalic acid, maleic acid, hexamic acid, phosphoric acid, alkyl phosphate ester, phthalic acid, acrylic acid or mixtures thereof.

8. The conductive ink of claim 7, wherein the acid is dinonylnaphthalene disulfonic acid.

9. The conductive ink of claim 6, wherein the flow additives are selected from the group consisting of silicon polymers, ethyl acrylate/2-ethylhexyl acrylate copolymers, alkylol ammonium salt of acid phosphoric acid esters of ketoxime or mixtures thereof.

10. The conductive ink of claim 6, wherein the adhesion promotor is a silane.

11. The conductive ink of claim 10, wherein the adhesion promoter is mercaptosilane.

12. The conductive ink of claim 6, wherein the rheology modifer is thermoplastic resin.

13. The conductive ink of claim 12, wherein the rheology modifier is polyvinyl acetal.

14. The conductive ink of claim 6, wherein the conductivity additive is selected from the group consisting of hydroquinone, Vitamin E, metallic dryers, titanates, phosphoric acid, other acid catalysts, or mixtures thereof.

15. A conductive ink composition consisting essentially of:
   (a) about 1 to 20 weight percent of at least one epoxy resin, about 0.2 to 15 weight percent of methoxymethylmelamine and about 0.1 to 5 weight percent of a catalyst;
   (b) about 50 to 90 weight percent of a particulated electrically conductive material;
   (c) about 5 to 50 weight percent of an organic solvent; and
   (d) about 0 to 5 weight percent of flow additives, adhesion promoters, rheology modifiers or mixtures thereof.

* * * * *